United States Patent [19]

Tatsumi

[11] Patent Number: 5,440,306
[45] Date of Patent: Aug. 8, 1995

[54] SWITCHED CAPACITOR CIRCUIT HAVING REDUCED CAPACITANCE UNITS

[75] Inventor: Satoshi Tatsumi, Tokyo, Japan

[73] Assignee: NEC Corporation, Tokyo, Japan

[21] Appl. No.: 156,812

[22] Filed: Nov. 22, 1993

[30] Foreign Application Priority Data

Nov. 20, 1992 [JP] Japan .................................. 4-312416

[51] Int. Cl.⁶ ............................................. H03M 1/80
[52] U.S. Cl. .................................... 341/150; 341/153
[58] Field of Search ................. 341/144, 145, 150, 153

[56] References Cited

U.S. PATENT DOCUMENTS

| | | | |
|---|---|---|---|
| 4,872,011 | 10/1989 | Pelgrom et al. ...................... | 341/150 |
| 4,873,525 | 10/1989 | Iida ...................................... | 341/145 |
| 5,274,376 | 12/1993 | Phillips et al. ...................... | 341/150 |

*Primary Examiner*—Marc S. Hoff
*Attorney, Agent, or Firm*—Ostrolenk, Faber, Gerb & Soffen

[57] ABSTRACT

A switched capacitor circuit includes a first capacitor (102) connected between first and second nodes (101, 103), a second capacitor ($C_1$) connected between the first node and an intermediate node (M), and a third capacitor ($C_2$) connected between the intermediate node (M) and ground. A group of m parallel circuits are connected between the intermediate node and the second node. Each of the m parallel circuits has a fourth capacitor ($C_V$) and a switch ($D_V$) for coupling it to ground or to the second node (103) depending on a corresponding one of m bits of an N-bit gain control signal. (N−m) parallel circuits are connected between the first and second nodes, each including a fifth capacitor and a switch for charging it depending on one of (N−m) bits of the N-bit gain control signal. A first sampling switch ($S_1$) couples an input voltage to the first node (101) in response to the first phase of a two-phase clock signal and coupling the first node to ground in response to the second phase. A second sampling switch provides charging of a sixth capacitor (104), connected to the second node, in response to the first phase and discharges energy from it to an output terminal of the switched capacitor circuit in response to the second phase.

6 Claims, 4 Drawing Sheets

SWITCHED CAPACITOR CIRCUIT HAVING REDUCED CAPACITANCE UNITS

BACKGROUND OF THE INVENTION

1. Field of the Invention

The present invention relates to a switched capacitor circuit which operates in response to a two-phase high frequency clock signal to synthesize an equivalent resistor.

2. Description of the Related Art

A prior art switched capacitor circuit as shown in FIG. 1 comprises a first sampling switch S1 of single-pole-double-throw (SPDT) type connected to an input terminal 100 for coupling it to a circuit node 101 in response to a first phase $\phi 1$ of a two-phase high frequency clock signal and coupling the node 101 to ground in response to the second phase $\phi 2$ of the clock signal. A second sampling switch S2 of the SPDT type is connected to a circuit node 103 for coupling it to ground in response to phase $\phi 1$ and coupling it, in response to phase $\phi 2$, to the inverting input of an operational amplifier 106, which functions as the energy supply source for the switched capacitor circuit. Between the circuit nodes 101 and 103 is provided a variable sampling capacitor circuit SC1 comprising a capacitor 102 with value $C_s$ which is in shunt with a plurality of gain control switches $D_i$ and sampling capacitors $C_i$ respectively connected to switches $D_i$, where i=1, 2, ... 8. The least to most significant bits of an eight-bit binary signal are applied respectively to the gain control switches $D_1$ to $D_8$ for coupling the associated capacitors in shunt with the fixed capacitor 102 in response to a bit "1". The capacitance of each of the switched capacitors $C_i$ is equal $2^i \times C_o$ where $C_o$ is the capacitance unit. The circuit node 103 is further connected through a transfer capacitor 104 to a third sampling switch S3 of the SPDT type. Third sampling switch S3 is responsive to phase $\phi 1$ for coupling the transfer capacitor 104 to ground for discharging it and responsive to phase $\phi 2$ for coupling it to the output terminal 107 to which the output of operational amplifier 106 is connected. A feedback capacitor 105 is connected between the inverting input of operational amplifier 106 and output terminal 107 to stabilize the operational amplifier when the inverting input is disconnected from circuit node 103. Since the gain ($V_{out}/V_{in}$) of the switched capacitor circuit is given by the ratio of the total capacitance of the variable sampling capacitor circuit SC1 to the capacitance $C_t$ of transfer capacitor 104, it can be adjusted to one of 256 capacitance ratios (i.e., $C_s/C_t$, $(C_s+C_o)/C_t$, $(C_s+2C_o)/C_t$, $(C_s+3C_o)/C_t$, ..., $(C_s+255C_o)/C_t$) in response to an 8-bit gain control signal, using 255 capacitance units.

From the power savings standpoint of the operational amplifier 106 it is desirable to reduce the total number of capacitance units as well as to reduce the value of the capacitance unit itself. However, the precision of the capacitance ratio tends to decrease as the value of the capacitance unit $C_o$ decreases due to the process limitations imposed by the integrated circuit technique. Since the capacitance unit value $C_o$ cannot be reduced below what is obtainable by the integrated circuit technology, it is important to reduce the total number of capacitance units.

To reduce the total number of capacitance units $C_o$ to 131 units, as well as the total of the capacitances of sampling capacitor and transfer capacitor to 1/64 of FIG. 1, a variable sampling capacitor circuit SC2 of what is known as the ladder or T-type structure is shown in FIG. 2. According to this prior art, each of the switched capacitor circuits formed by gain control switches $D_k$ (where k=1, 2, 3, ... 6) includes a series of capacitors $C_{k1}$ and $C_{k3}$ and a capacitor $C_{k2}$ connected across the node between capacitors $C_{k1}$ and $C_{k3}$ and ground. All capacitors $C_{k1}$ and $C_{k3}$ except for $C_{63}$ has unit capacitance value $C_o$, while capacitor $C_{63}$ has twice the unit capacitance value, and all capacitors $C_{k2}$ except for capacitor $C_{62}$ has a capacitance equal to $(2^{(7-k)}-2)C_o$ and the capacitor $C_{62}$ is of the unit value $C_o$. The values of capacitors 102 and 104 are reduced to $C_s/64$ and $C_t/64$, respectively. After charging the capacitors $C_{k1}$, $C_{k2}$ and $C_{k3}$, the charge stored on capacitor $C_{k3}$ is transferred to the transfer capacitor 104. Since the amount of energies discharged by the gain control sampling capacitors is given by $V_{in} \times C_{k1} \times C_{k3}/(C_{k1}+C_{k2}+C_{k3})$, each of the capacitor networks connected to switches $D_1$ to $D_6$ has an equivalent capacitance $C_{k1} \times C_{k3}/(C_{k1}+C_{k2}+C_{k3})$ ranging from $C_o/64$ to $C_o/2$. A further prior art sampling capacitor circuit SC3 which is known as the $\pi$ structure reduces the total number of capacitance units $C_o$ to 65 units as shown in FIG. 3. According to this $\pi$ structure each of the capacitor networks associated with switches $D_j$ (where j=1 and 2) is formed by a series of unit-value capacitors $C_{j1}$, $C_{j3}$, $C_{j5}$ and grounded capacitors $C_{j2}$ and $C_{j4}$ respectively coupled to the node between capacitors $C_{j1}$ and $C_{j3}$ and the node between $C_{j3}$ and $C_{j5}$. The values of the grounded capacitors $C_{12}$ and $C_{14}$ are $3C_o$ and $11C_o$, respectively, and those of the grounded capacitors $C_{22}$ and $C_{24}$ are $C_o$ and $9C_o$, respectively. The quantity of the charges transferred from the gain control sampling capacitors is given by $V_{in} \times C_{j1} \times C_{j3} \times C_{j5}/\{(C_{j1}+C_{j2})(C_{j3}+C_{j4}+C_{j5})+C_{j3}(-C_{j4}+C_{j5})\}$. The equivalent capacitances of the capacitor networks with switches $D_1$ and $D_2$ are equal to $C_o/64$ and $C_o/32$, respectively.

However, there is still a need to decrease the number of capacitance units for each of the T- and $\pi$-type of sampling capacitor networks.

SUMMARY OF THE INVENTION

It is therefore an object of the present invention to provide a switched capacitor circuit having a smaller number of capacitance units.

According to a first aspect of the present invention, there is provided a switched capacitor circuit which comprises a first capacitor connected between first and second nodes, a second capacitor connected between the first node and a third node, and a third capacitor connected between the third node (M) and a reference potential. A plurality of m parallel circuits are connected between the third node and the second node. Each of the m parallel circuits includes a fourth capacitor and a switch for coupling the fourth capacitor to the reference potential or to the second node depending on a corresponding one of m bits of an N-bit gain control signal, where m is an integer smaller than N. (N−m) parallel circuits are connected between the first and second nodes. Each of the (N−m) parallel circuits includes a fifth capacitor and a switch for charging the fifth capacitor depending on one of (N−m) bits of the N-bit gain control signal. A first sampling switch is provided for applying an input signal of the switched capacitor circuit to the first node in response to a first phase of a two-phase high frequency clock signal and coupling the first node to the reference potential in response to a second phase of the two-phase high frequency clock signal. A second sampling switch provides charging of a sixth capacitor, which is connected to the second node, in response to the first phase of the clock signal and discharges stored energy from the sixth capacitor to an output terminal of the switched capacitor circuit in response to the second phase of the clock signal.

According to a second aspect of the present invention, there is switched capacitor circuit comprising a first capacitor connected between a first node and a second node. Second and third capacitors are connected in series between the first node and a third node. A fourth capacitor is connected across a node between the second and third capacitors and a reference potential and a fifth capacitor is connected between the third node and the reference potential. A plurality of m parallel circuits are connected between the third node and the second node, each of the m parallel circuits including a sixth capacitor and a switch for coupling the sixth capacitor to the reference potential or to the second node depending on a corresponding one of m bits of an N-bit gain control signal, where m is an integer smaller than N. (N−m) parallel circuits are connected between the first and second nodes, each of the (N−m) parallel circuits including a seventh capacitor and a switch for charging the seventh capacitor depending on a corresponding one of (N−m) bits of the N-bit gain control signal. A first sampling switch applies the input signal of the switched capacitor circuit to the first node in response to a first phase of a two-phase high frequency clock signal and coupling the first node to the reference potential in response to a second phase of the two-phase high frequency clock signal. A second sampling switch provides charging of an eighth capacitor, which is connected to the second node, in response to the first phase of the clock signal and discharges stored energy from the eighth capacitor to an output terminal of the switched capacitor circuit in response to the second phase of the clock signal.

BRIEF DESCRIPTION OF THE DRAWINGS

The present invention will be described in further detail with reference to the accompanying drawings, in which.

DETAILED DESCRIPTION

Figure 4:
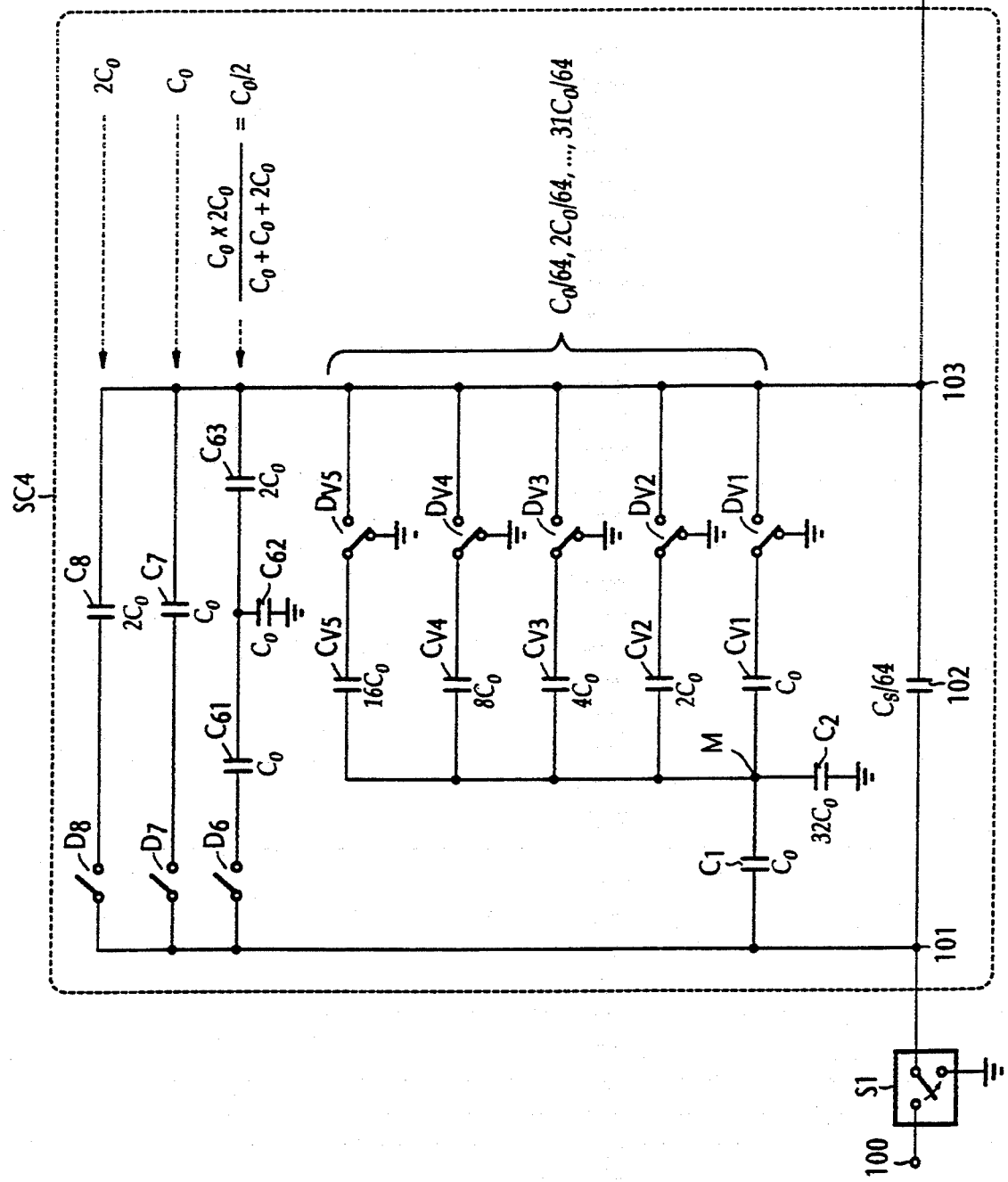
FIG. 4 is a circuit diagram of a switched capacitor circuit according to a first embodiment of the present invention.

In order to reduce the number of unit capacitances $C_o$ of the T-type sampling capacitor circuit, a first embodiment of the present invention is shown in FIG. 4. The sampling capacitor circuit SC4 of this embodiment comprises a unit-value capacitor $C_1$ connected between the node 101 and a node M and a capacitor $C_2$ with a value of $32C_o$ connected between node M and ground, which serves a reference potential. Between the circuit nodes M and 103 is connected a plurality of parallel circuits each including a capacitor $C_{Vm}$ connected in series with a single-pole-double-throw (SPDT) switch $D_{Vm}$, where m = 1, 2, ... 5, and the value of each capacitor $C_{Vm}$ is equal to $2^{(m-1)}C_o$. The least significant bit to the fifth significant bit of an 8 bit gain control signal are applied respectively to SPDT switches $D_{V1}$ to $D_{V5}$. Each of the SPDT switches $D_{Vm}$ is responsive to a bit "1" for coupling the associated capacitor $C_{Vm}$ to the node 103 and responsive to a "0" for coupling that capacitor to ground.

When switches $S_1$, $S_2$ and $S_3$ are changed to position "a" in response to the phase $\phi 1$ of a two-phase high frequency clock, a charging current is supplied from terminal 100 and all capacitors $C_{Vm}$ are charged regardless of the positions of their associated switches $D_{Vm}$ to develop a voltage $V_M$ at node M. More specifically, those of capacitors $C_{Vm}$ which are coupled to ground by the corresponding switches $D_{Vm}$ (to which a bit "0" is applied) allow the charging currents to find their paths to ground through such bit-0-applied switches, and the other capacitors which are coupled to node 103 by the associated switches $D_{Vm}$ (to which a bit "1" is applied) allow the charging currents to find their paths through switch $S_2$. Therefore, the node voltage $V_M$, which is given below, is precisely proportional to the voltage $V_{in}$ at input terminal 100, regardless of the operating states of switches $D_{V1}$ to $D_{V5}$:

$$V_M = \frac{C_1}{C_1 + C_2 + \sum_{m=1}^{5} C_{Vm}} \cdot V_{in} \quad (1)$$

When switches $S_1$, $S_2$ and $S_3$ are changed to position "b" in response to the phase $\phi 2$ of the two-phase clock, those of the sampling capacitors which are coupled to node 103 are brought into a series connection by switch $S_3$ to the transfer capacitor 104. The amount of energies discharged by the gain control sampling capacitors $C_{V1} \sim C_{V5}$ is given by:

$$Q = V_M \cdot \sum_{m=1}^{M} C_{Vm} \quad (2)$$

where M is the total number of capacitors $C_{Vm}$ which are connected to node 103. Therefore, the equivalent capacitance ratio R is expressed by:

$$R = \frac{C_1 \sum_{m=1}^{M} C_{Vm}}{C_1 + C_2 + \sum_{m=1}^{5} C_{Vm}} = \frac{\sum_{m=1}^{M} C_{Vm}}{64} \quad (3)$$

It is seen that if each one of the capacitors $C_{V1} \sim C_{V5}$ is coupled exclusively to node 103, a capacitance value $C_o/64$, $2C_o/64$, $4C_o/64$, $8C_o/64$ or $16C_o/64$ is brought into shunt with the fixed sampling capacitor 102. Therefore, a capacitance value ranging from a minimum of $C_o/64$ to a maximum of $31C_o/64$ with an increment of $C_o/64$ can be provided by a combination of the least significant bit to the fifth significant bit of the 8-bit gain control signal.

Figure 1:
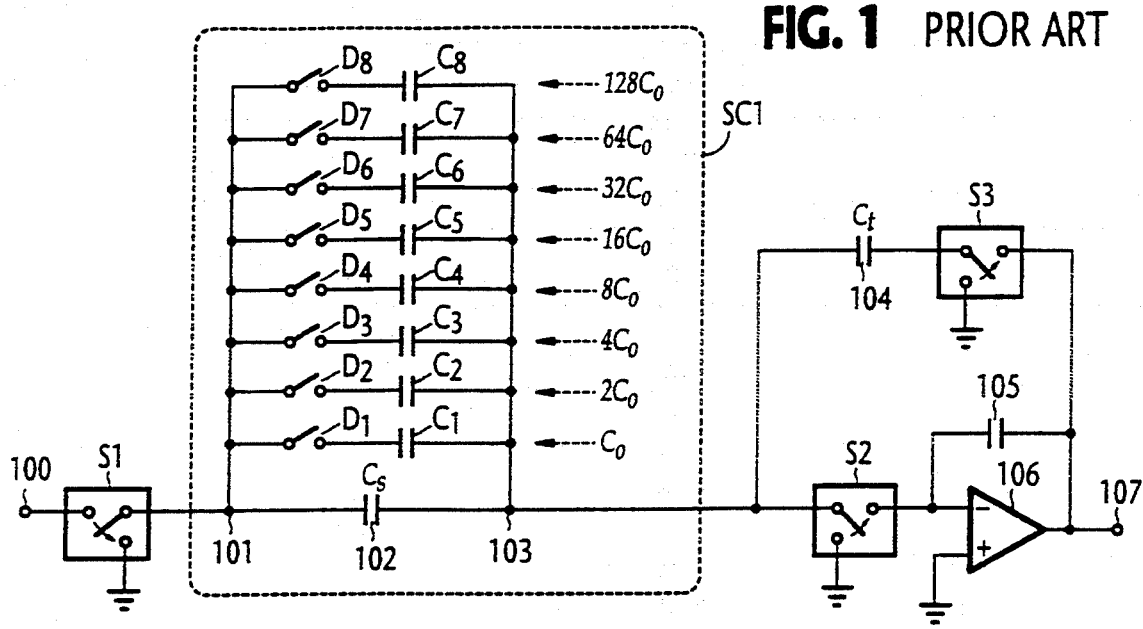
FIG. 1 is a circuit diagram of a first prior art switched capacitor circuit.
Figure 2:
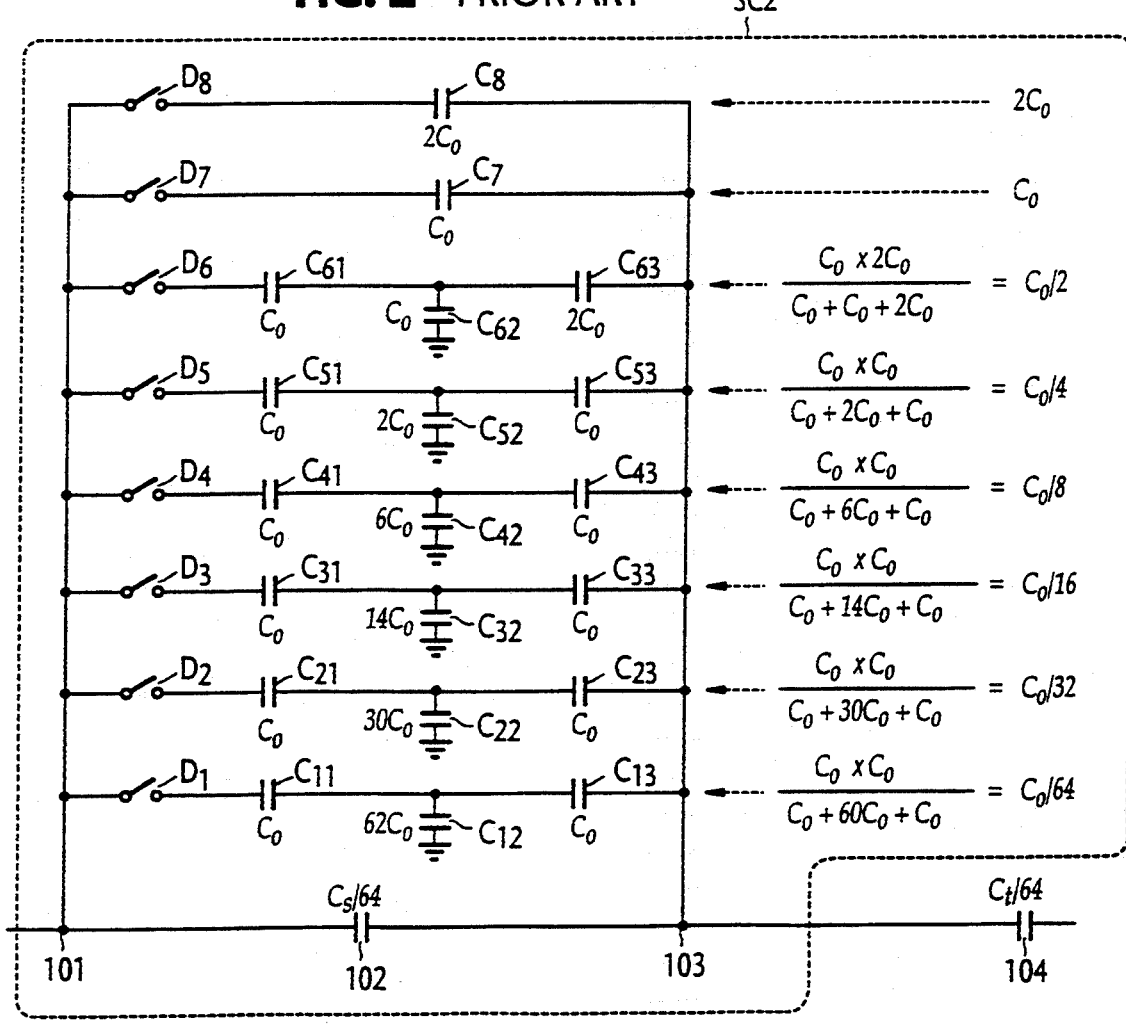
FIG. 2 is a circuit diagram of a second prior art switched capacitor circuit of T-type structure.
Figure 3:
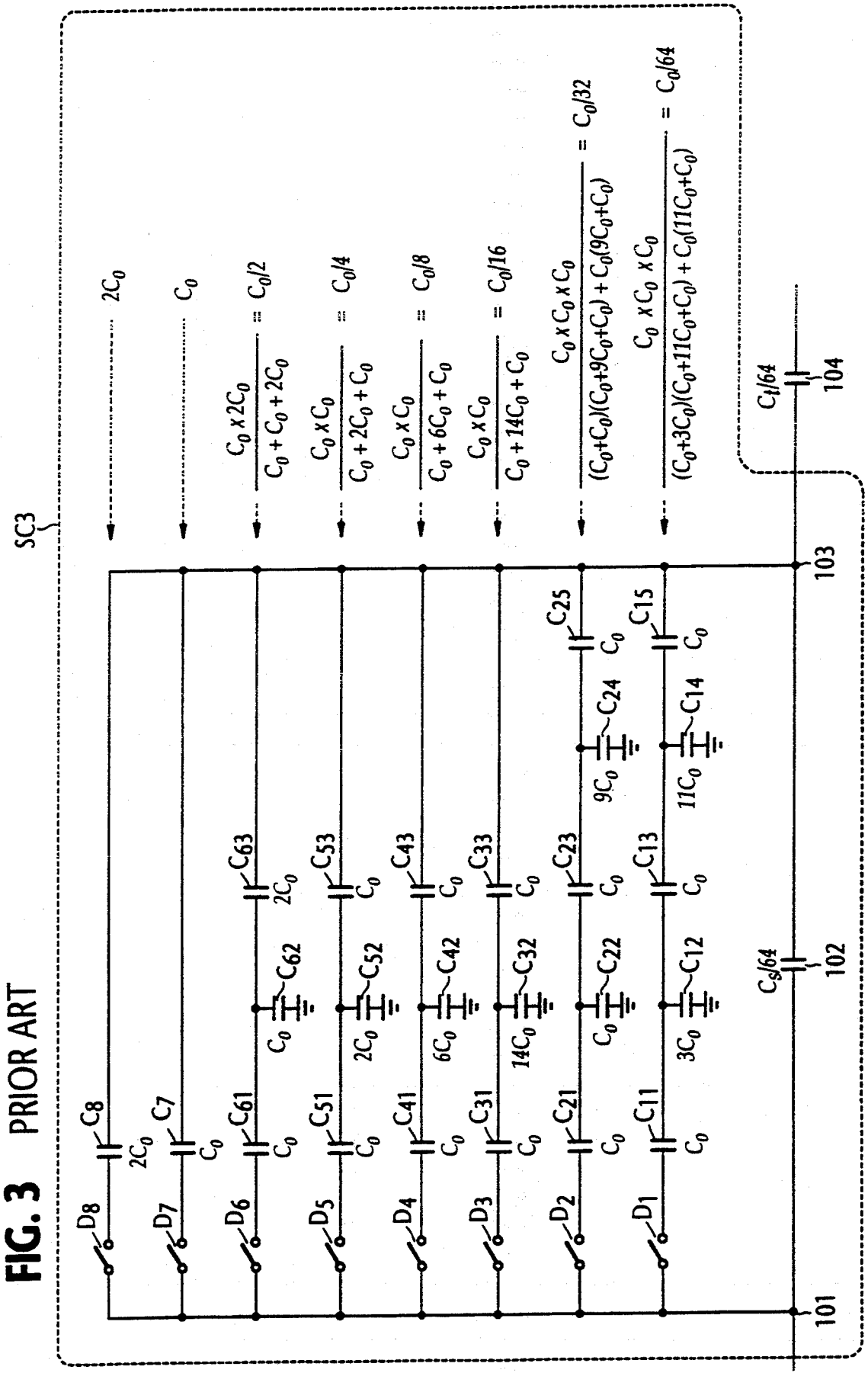
FIG. 3 is a circuit diagram of a third prior art switched capacitor circuit of $\pi$-type structure.

The sampling capacitor circuit SC4 of this invention includes the switches $D_6$ to $D_8$ and their associated capacitors in the same manner as shown in FIGS. 2 and 3. Since the switches $D_6$ to $D_8$ are respectively responsive to the sixth to the most significant bits of the 8-bit gain control signal, the application of a bit "1" to switch $D_6$ brings a capacitance $C_o/2$ (=$32C_o/64$) in shunt with the fixed sampling capacitor 102 as the next value to the maximum value of $31C_o/64$ which is provided if all capacitors $C_{V1}$ to $C_{V5}$ are coupled to node 103. In like manner, the operation of switches $D_7$ and $D_8$ brings equivalent capacitances $C_o$ and $2C_o$ in shunt with the fixed sampling capacitor 102.

It follows that a maximum of 256 capacitance ratios can be provided by a combination of any of switches $D_{V1} \sim D_{V5}$, $D_6$ to $D_8$ using 71 unit-value capacitors, representing a reduction of 60 capacitance units in comparison with the prior art T-type sampling capacitor circuit of FIG. 2.

Figure 5:
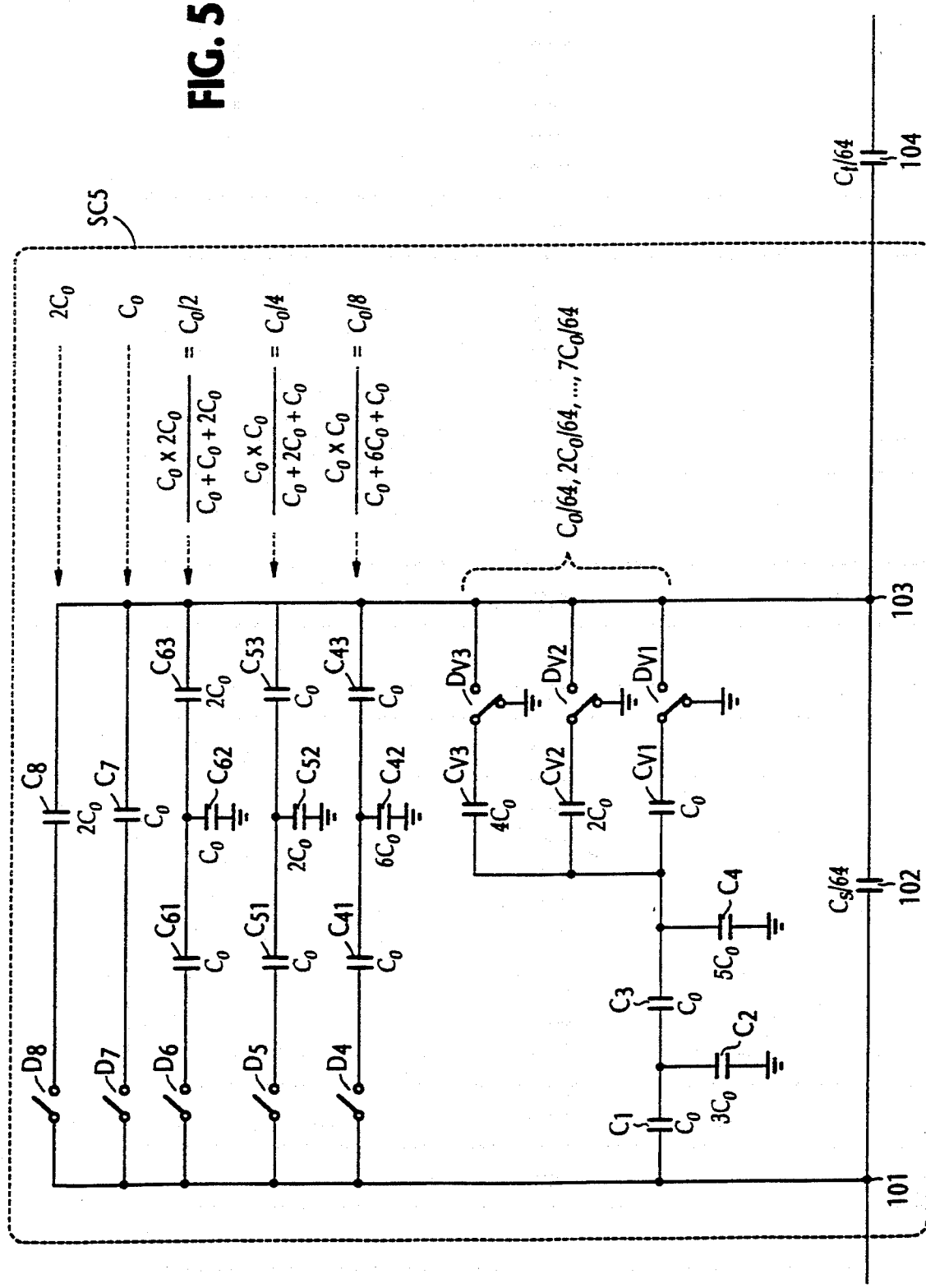
FIG. 5 is a circuit diagram of a switched capacitor circuit according to a second embodiment of the present invention.

A second embodiment of the present invention is shown in FIG. 5. This embodiment is an improvement over the prior art $\pi$-type sampling capacitor circuit of FIG. 3. The sampling capacitor circuit SC5 of this embodiment includes the same capacitor networks formed by the gain control switches $D_4$ to $D_8$ and their associated capacitors $C_{41}$-$C_{43}$, $C_{51}$-$C_{53}$, $C_{61}$-$C_{63}$, $C_7$ and $C_8$ as used in the prior art of FIG. 3. The fourth significant bit to the most significant bit of an 8 bit gain control signal are applied respectively to SPDT switches $D_4$ to $D_8$.

The sampling capacitor circuit SC5 includes a series of unit-value ($C_o$) capacitors $C_1$ and $C_3$ between circuit nodes 101 and M', a capacitor $C_2$ with value $3C_o$ connected across the node between capacitors $C_1$ and $C_3$ and ground, and a capacitor $C_4$ with value $5C_o$ connected between the node M' and ground. Between the circuit nodes M' and 103 is connected a plurality of parallel circuits each including a capacitor $C_{Vm}$ connected in series with a single-pole-double-throw (SPDT) switch $D_{Vm}$, where m=1, 2 and 3, and the value of each capacitor $C_{Vm}$ is equal to $2^{(m-1)}C_o$. The least significant bit to the third significant bit of the 8 bit gain control signal are applied respectively to SPDT switches $D_{V1}$ to $D_{V3}$. Similar to the first embodiment, each of the SPDT switches $D_{Vm}$ is responsive to a bit "1" for coupling the associated capacitor $C_{Vm}$ to the node 103 and responsive to a "0" for coupling that capacitor to ground.

When switches $S_1$, $S_2$ and $S_3$ are changed to position "a" in response to the phase $\phi_1$ of a two-phase high frequency clock, a charging current is supplied from terminal 100 and capacitors $C_{V1}$ to $C_{V3}$ are charged regardless of the positions of their associated switches to develop a voltage $V'_M$ at node M' which is given by:

$$V_M = \frac{C_1 \cdot C_3}{(C_1 + C_2)\left(C_3 + C_4 + \sum_{m=1}^{3} C_{Vm}\right) + C_3\left(C_4 + \sum_{m=1}^{3} C_{Vm}\right)+} \cdot V_{in} \qquad (4)$$

When switches $S_1$, $S_2$ and $S_3$ are changed to position "b" in response to phase $\phi_2$, those of the sampling capacitors which are coupled to node 103 are brought into a series connection by switch $S_3$ to the transfer capacitor 104. The amount of charges transferred from the gain control sampling capacitors $C_{V1} \sim C_{V3}$ is given by:

$$Q = V_M \cdot \sum_{m=1}^{M} C_{Vm} \qquad (5)$$

Therefore, the equivalent capacitance ratio R is expressed by:

$$R = \frac{C_1 \cdot C_3 \sum_{m=1}^{M} C_{Vm}}{(C_1+C_2)\left(C_3+C_4+\sum_{m=1}^{3} C_{Vm}\right)+C_3\left(C_4+\sum_{m=1}^{3} C_{Vm}\right)} \qquad (6)$$

$$= \frac{\sum_{m=1}^{M} C_{Vm}}{64}$$

If each one of the capacitors $C_{V1} \sim C_{V3}$ is coupled exclusively to node 103, an equivalent capacitance value $C_o/64$, $2C_o/64$, or $4C_o/64$ is brought into shunt with the fixed sampling capacitor 102. Therefore, a capacitance value ranging from a minimum of $C_o/64$ to a maximum of $7C_o/64$ can be provided by a combination of the least significant bit to the third significant bit of the 8-bit gain control signal. The capacitors associated with the switches $D_4$ to $D_8$ add an equivalent capacitance ranging from $C_o/8$ to $2C_o$. to the range of values provided by capacitors $C_{V1}$ to $C_{V3}$. The total number of capacitance units is reduced to 36, representing a reduction of 29 units in comparison with the prior art $\pi$-type sampling capacitor circuit of FIG. 3.

What is claimed is:

1. A switched capacitor circuit comprising:
    a first capacitor connected between a first node and a second node;
    a second capacitor connected between the first node and a third node;
    a third capacitor connected between the third node and a reference potential;
    m parallel circuits connected between the third node and the second node, the m parallel circuits including respective fourth capacitors and respective first switch means for coupling the fourth capacitors to the reference potential or to the second node depending on a corresponding one of m bits of an N-bit gain control signal, where m is an integer smaller than N;
    n parallel circuits connected between the first and second nodes, the n parallel circuits including respective fifth capacitors and respective second switch means for coupling the first node to the fifth capacitors depending on a corresponding one of n bits of the N-bit gain control signal, where n is an integer equal to N−m;
    third switch means for applying an input signal of the switched capacitor circuit to the first node in response to a first phase of a two-phase high frequency clock signal and coupling the first node to the reference potential in response to a second phase of the two-phase high frequency clock signal;
    a sixth capacitor connected to the second node; and fourth switch means for charging the sixth capacitor in response to said first phase and discharging energy from the sixth capacitor to an output terminal of the switched capacitor circuit in response to said second phase.

2. A switched capacitor circuit as claimed in claim 1, wherein each of the fourth capacitors of the m parallel circuits has a capacitance equal to $2^{(j-1)} \times C_0$, where $C_0$ is a unit value and j=1, 2, ... m, and wherein each of the fifth capacitors ($C_6$-$C_8$) of said n parallel circuits has an equivalent capacitance value equal to $C_0/2(N-k-1)$, where k=m+1 to N.

3. A switched capacitor circuit as claimed in claim 2, wherein the capacitances of said second and third capacitors are respectively equal to $C_0$ and $2^m \times C_0$ 4. A switched capacitor circuit comprising:
- a first capacitor connected between a first node and a second node;
- second and third capacitors connected in series between the first node and a third node;
- a fourth capacitor connected across a node between said second and third capacitors and a reference potential;
- a fifth capacitor connected between the third node and the reference potential;
- m parallel circuits connected between the third node and the second node, the m parallel circuits including respective sixth capacitors and respective first switch means for coupling the sixth capacitors to the reference potential or to the second node depending on a corresponding one of m bits of an N-bit gain control signal, where m is an integer smaller than N;
- n parallel circuits connected between the first and second nodes, the n parallel circuits including respective seventh capacitors and respective second switch means for coupling the first node to the seventh capacitor depending on a corresponding one of n bits of the N-bit gain control signal, where n is an integer equal to N−m;
- third switch means for applying an input signal of the switched capacitor circuit to the first node in response to a first phase of a two-phase high frequency clock signal and coupling the first node to the reference potential in response to a second phase of the two-phase high frequency clock signal;
- an eighth capacitor connected to the second node; and
- fourth switch means for charging the eighth capacitor in response to said first phase and discharging energy from the eighth capacitor to an output terminal of the switched capacitor circuit in response to said second phase.

5. A switched capacitor circuit as claimed in claim 4, wherein each of the seventh capacitors of the m parallel circuits has a capacitance equal to $2^{(j-1)} \times C_0$, where $C_0$ is a unit value and j=1, 2, ... m, and wherein each of the seventh capacitors of said n parallel circuits has an equivalent capacitance value equal to $C_0/2$ (N-k-1), where k=m+1 to N.

6. A switched capacitor circuit as claimed in claim 4, wherein the capacitance of each of the second and third capacitors is equal to $C_0$, and the capacitances of the fourth and fifth capacitors are equal to $3C_0$ and $5C_0$, respectively.

* * * * *